United States Patent
Kawai et al.

(10) Patent No.: US 10,476,475 B2
(45) Date of Patent: Nov. 12, 2019

(54) PIEZOELECTRIC RESONATOR UNIT AND MANUFACTURING METHOD FOR THE SAME

(71) Applicant: Murata Manufacturing Co., Ltd., Nagaokakyo-shi, Kyoto-fu (JP)

(72) Inventors: Ryuichi Kawai, Nagaokakyo (JP); Hiroshi Ibaragi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 329 days.

(21) Appl. No.: 15/617,002

(22) Filed: Jun. 8, 2017

(65) Prior Publication Data

US 2017/0366161 A1 Dec. 21, 2017

(30) Foreign Application Priority Data

Jun. 16, 2016 (JP) ................................ 2016-119950

(51) Int. Cl.
| | |
|---|---|
| *H01L 41/053* | (2006.01) |
| *H03H 9/17* | (2006.01) |
| *H03H 3/02* | (2006.01) |
| *H03H 9/05* | (2006.01) |
| *H03H 9/10* | (2006.01) |
| *H01L 41/047* | (2006.01) |

(52) U.S. Cl.
CPC ............. *H03H 9/176* (2013.01); *H03H 3/02* (2013.01); *H03H 9/0519* (2013.01); *H03H 9/1021* (2013.01); *H01L 2924/16152* (2013.01); *H03H 2003/022* (2013.01)

(58) Field of Classification Search
CPC ........ H03H 9/176; H03H 3/02; H03H 9/0519; H03H 9/1021; H03H 2003/022; H01L 2924/16152
USPC .................................................. 310/340, 348
See application file for complete search history.

(56) References Cited

U.S. PATENT DOCUMENTS

| | | | | |
|---|---|---|---|---|
| 2004/0100164 | A1* | 5/2004 | Murata | H01L 24/97 310/348 |
| 2012/0067611 | A1* | 3/2012 | Kohda | H03H 9/1021 174/50.54 |
| 2014/0346930 | A1* | 11/2014 | Kohda | H01L 41/0533 310/344 |
| 2018/0167050 | A1* | 6/2018 | Yoshii | H03H 9/1021 |

FOREIGN PATENT DOCUMENTS

JP 2014060313 A 4/2014

* cited by examiner

*Primary Examiner* — Thomas M Dougherty
(74) *Attorney, Agent, or Firm* — Arent Fox LLP (57) ABSTRACT

A method for manufacturing a piezoelectric resonator unit by forming a via conductor in a through hole of a ceramic substrate, forming a connection electrode foundation layer connected to the via conductor, and forming a sealing frame foundation layer in a substantially frame shape. The ceramic substrate is then fired together with the via conductor, the connection electrode foundation layer, and the sealing frame foundation layer. The surface of the connection electrode foundation layer and the surface of the sealing frame foundation layer are flattened by pressing the ceramic substrate from a first main surface side and a second main surface side thereof. A plating treatment is carried out to form a connecting electrode and a sealing frame. A piezoelectric resonator is electrically connected to the connection electrode.

7 Claims, 10 Drawing Sheets

PIEZOELECTRIC RESONATOR UNIT AND MANUFACTURING METHOD FOR THE SAME

CROSS REFERENCE TO RELATED APPLICATIONS

The present application claims priority to Japanese Patent Application No. 2016-119950, filed Jun. 16, 2016, the entire contents of which is incorporated herein by reference.

BACKGROUND OF THE INVENTION

Field of the Invention

The present invention relates to a piezoelectric resonator unit and a manufacturing method for the same.

Description of the Related Art

As a structure for hermetically sealing an electronic component in a container, it is known that a container for an electronic devices stores an electronic component inside of a space enclosed by a base substrate on a flat plate and a concave lid body bonded to the base substrate. For example, in Japanese Unexamined Patent Application Publication No. 2014-60313, a piezoelectric resonator unit is disclosed in which a quartz resonator is sealed in an inner space of a container having a lid body bonded to the annular sealing portion formed on a base substrate, and in which the quartz resonator is mounted on the base substrate with element mounting pads interposed therebetween. In the piezoelectric resonator unit, element mounting pads formed on the surface of the base substrate and one of mounting terminals formed on the back surface are electrically conducted by a through via.

However, in the base substrate as disclosed in Japanese Unexamined Patent Application Publication No. 2014-60313, the through via is raised and the flatness is not maintained when the preliminary firing is performed due to the difference in shrinkage rate between the base substrate and the through via, the shape of the element mounting pad formed thereon becomes unstable. Therefore, the bonding of the crystal resonator becomes unstable, and there is a problem that the fluctuation range of the bonding strength becomes large.

SUMMARY OF THE INVENTION

The present invention has been made in view of the above circumstances, and an object thereof is to provide a piezoelectric resonator unit with improved bonding strength of a piezoelectric resonator as well as a manufacturing method for the same.

According to preferred embodiments of the present invention, a manufacturing method of a piezoelectric resonator unit includes forming a through hole penetrating a ceramic substrate from a first main surface to a second main surface thereof, forming a via conductor filling the through hole in the ceramic substrate, forming a connection electrode foundation layer connected to the via conductor on the first main surface, and forming a sealing frame foundation layer in a substantially frame shape on the first main surface of the ceramic substrate, firing the ceramic substrate together with the via conductor, the connection electrode foundation layer, and the sealing frame foundation layer, flattening the surface of the connection electrode foundation layer and the surface of the sealing frame foundation layer by pressing the ceramic substrate from a first main surface side and a second main surface side, performing plating treatment on the connection electrode foundation layer and the sealing frame foundation layer so as to form a connection electrode and a sealing frame, electrically connecting a piezoelectric resonator to the connection electrode, and bonding a lid member to the first main surface of the ceramic substrate so that the piezoelectric resonator is sealed in a space between the ceramic substrate and the lid member.

According to the method, it is possible to reduce variations in the bonding area of the conductive adhesive and stabilize the bonding strength by suppressing the occurrence of protrusions on the connection electrode. In addition, by improving the flatness of the sealing frame, it is possible to create a large bonding area between the sealing frame and the lid member, and thereby improve airtightness of sealing of the lid member.

According to preferred embodiments of the present invention, a piezoelectric resonator unit includes a ceramic substrate having a first main surface and a second main surface opposed to the first main surface, a via conductor filling a through hole penetrating the ceramic substrate from the first main surface to the second main surface, a connection electrode connected to the via conductor on the first main surface, a sealing frame provided in a substantially frame shape on the first main surface, a piezoelectric resonator electrically connected to the connection electrode, and a lid member bonded to the first main surface of the ceramic substrate so that the piezoelectric resonator is sealed in a space between the ceramic substrate and the lid member. The connection electrode and the sealing frame each have a multilayer structure including a lowermost layer and an uppermost layer. A difference between the maximum value and the minimum value of a height from the first main surface of the ceramic substrate to an upper surface of the lowermost layer of the connection electrode is less than 1 μm; the difference between the maximum value of the height from the first main surface of the ceramic substrate to the upper surface of the lowermost layer of the connection electrode and the maximum value of a height from the first main surface of the ceramic substrate to an upper surface of the lowermost layer of the sealing frame is less than 1 μm; and the flatness of the uppermost layer of the connection electrode and the uppermost layer of the sealing frame is 5 μm or less.

According to the above configuration, since the occurrence of protrusions is suppressed at the surface of connection electrode, variations in the bonding area of the conductive adhesive are reduced, and the bonding strength can be stabilized. Further, by improving the flatness of the sealing frame, a large bonding area between the sealing frame and the lid member is created, and the airtightness of the sealing of the lid member is improved.

Other features, elements, characteristics and advantages of the present invention will become more apparent from the following detailed description of preferred embodiments of the present invention (with reference to the attached drawings).

DETAILED DESCRIPTION OF THE PREFERRED EMBODIMENTS OF THE INVENTION

Embodiments of the present invention will be described below. In the description of the drawings below, the same or similar constituent elements are represented by the same or similar reference numerals. The drawings are examples, the dimensions and shapes of the respective parts are schematic, and the technical scope of the present invention should not be understood by being limited to the embodiment.

Figure 1:
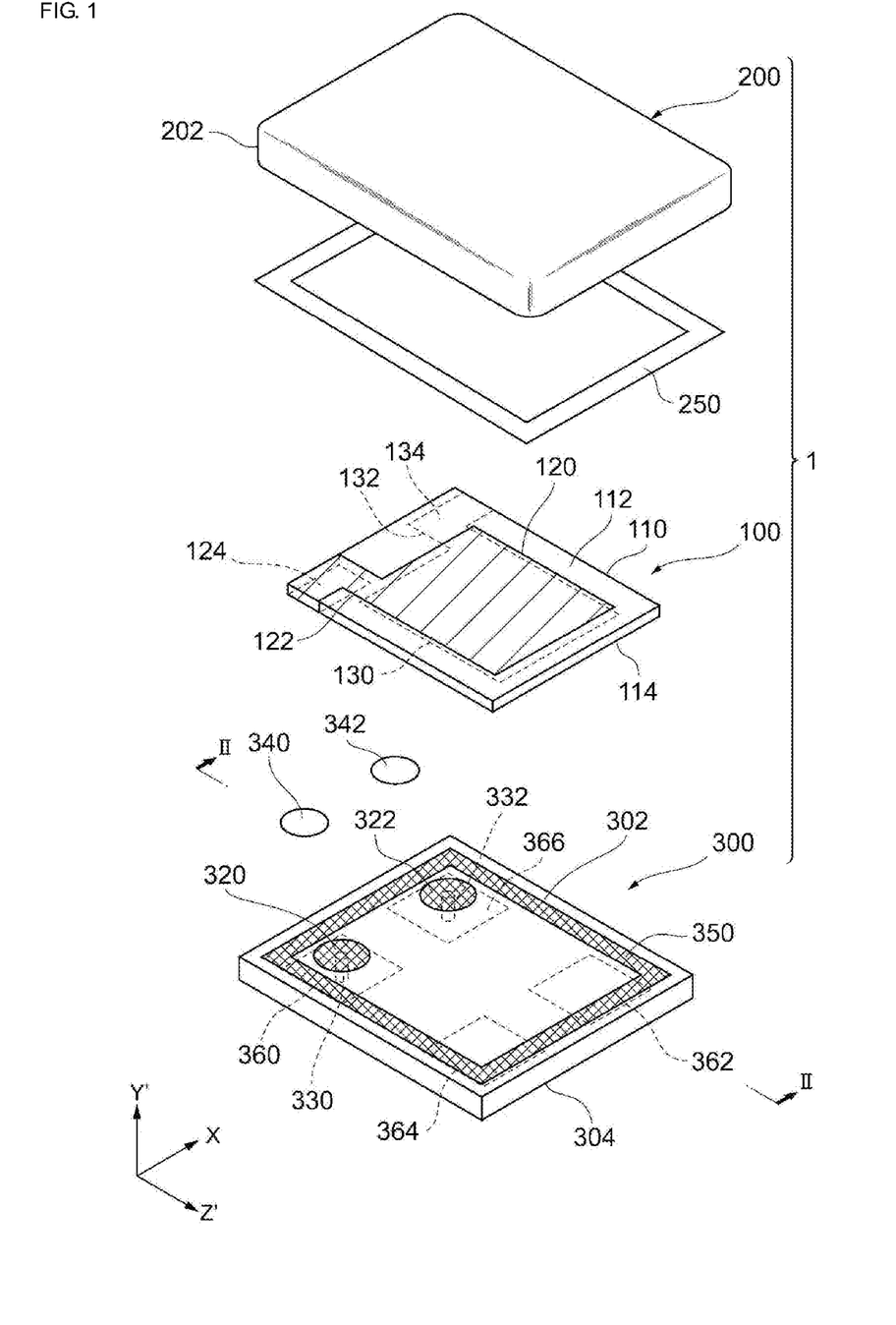
FIG. 1 is an exploded perspective view of a piezoelectric resonator unit according to an embodiment of the present invention.
Figure 2:
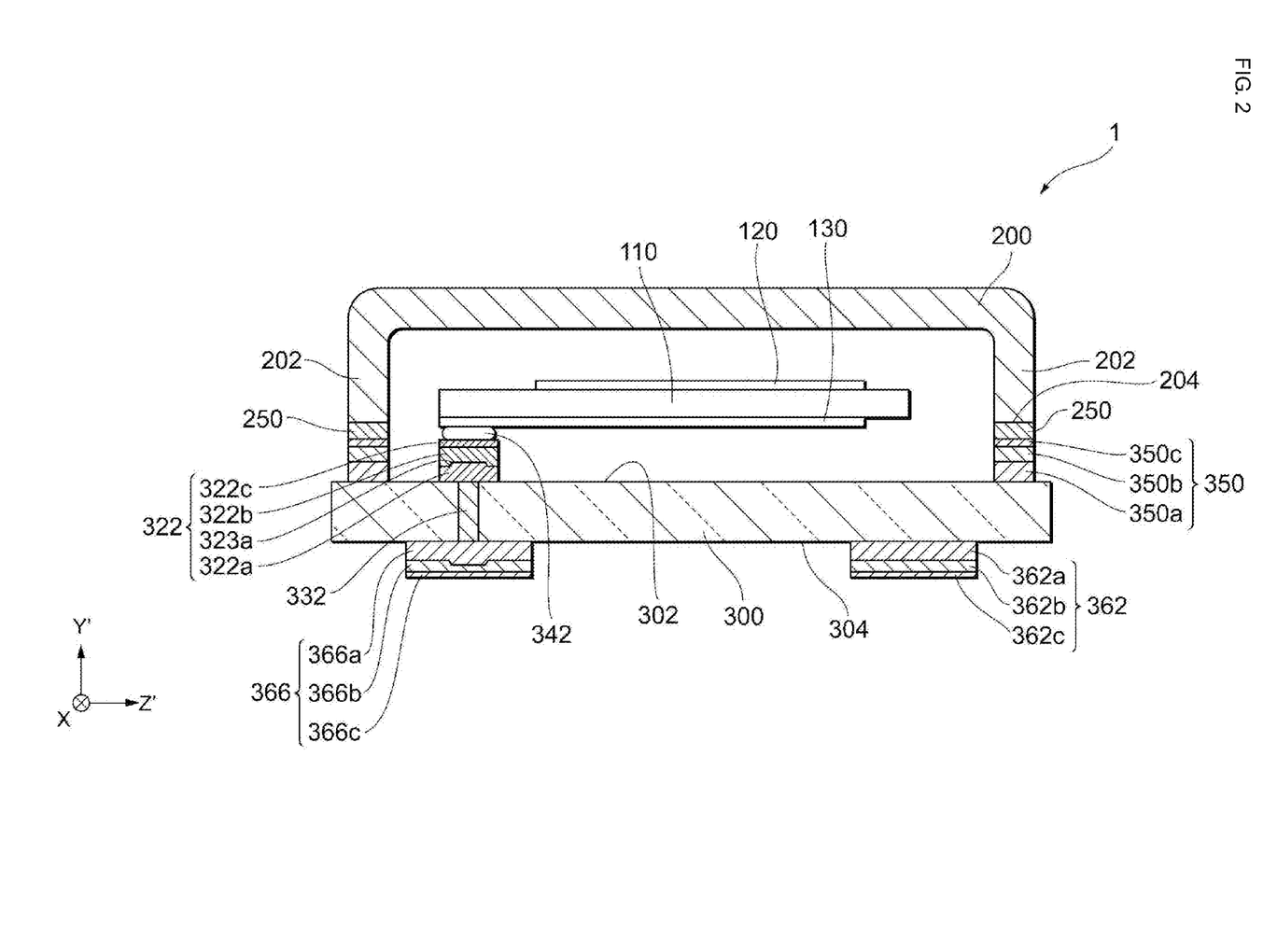
FIG. 2 is a cross-sectional sectional view in line II-II of FIG. 1.

A piezoelectric resonator unit 1 according to this embodiment will be described with reference to FIGS. 1 and 2. FIG. 1 is an exploded perspective view of a piezoelectric resonator unit according to one embodiment of the present invention, and FIG. 2 is a cross-sectional view in line II-II of FIG. 1. In FIG. 1, the thickness of each electrode is omitted.

As shown in FIG. 1, the piezoelectric resonator unit 1 according to the present embodiment includes a piezoelectric resonator 100, a lid member 200, and a substrate 300. The lid member 200 and the substrate 300 are part of the configuration of an enclosure (case or package) for accommodating the piezoelectric resonator 100.

The piezoelectric resonator 100 includes a piezoelectric substrate 110 and excitation electrodes 120 and 130 (hereinafter also referred to as "first excitation electrode 120 and second excitation electrode 130") respectively provided on the front and back surfaces of the piezoelectric substrate 110. The first excitation electrode 120 is provided on the first main surface 112 of the piezoelectric substrate 110 and the second excitation electrode 130 is provided on the second main surface 114 which is the main surface opposed to the first main surface 112 of the piezoelectric substrate 110.

The piezoelectric substrate 110 is formed of a predetermined piezoelectric material, and its material is not particularly limited. In the example shown in FIG. 1, the piezoelectric substrate 110 has a trigonal system different from a cubic system such as a piezoelectric ceramic, and is formed of a quartz material having a predetermined crystal orientation. The piezoelectric resonator 100 may be a crystal resonator having a quartz blank made of a quartz material. The piezoelectric substrate 110 is, for example, an AT-cut crystal blank. The AT cut crystal blank, in the X axis, the Y' axis, and the Z' axis which are the crystal axes of the artificial quartz, when the Y' axis and the Z' axis are rotated by about 35 degrees 15 minutes±1 minute 30 seconds in the direction from the Y' axis to the Z' axis around the X axis, then these axes are specified as Y' axis and Z' axis, respectively, is a plane cut as a main surface which is parallel to the above specified plane, the plane specified by the X axis and Z' axis (hereinafter referred to as "XZ' plane": the same applies to the plane specified by other axes). In the example shown in FIG. 1, the piezoelectric substrate 110, which is an AT-cut crystal blank, has a longitudinal direction parallel to the Z'-axis direction, a short-side direction parallel to the X-axis direction, and a thickness direction parallel to the Y'-axis direction, and has a substantially rectangular shape in the XZ' plane. A piezoelectric resonator using an AT-cut crystal blank has extremely high frequency stability over a wide temperature range and can also be manufactured with excellent change over time characteristics. In addition, the piezoelectric resonator using the AT-cut crystal blank includes a thickness shear mode as a main vibration. Hereinafter, each configuration of the piezoelectric resonator unit 1 will be described with reference to the axial direction of the AT cut.

The piezoelectric substrate is not limited to the above structure, and for example, a substantially rectangular AT-cut crystal blank having a longitudinal direction parallel to the X-axis direction and a short-side direction parallel to the Z'-axis direction may be applied. Alternatively, as long as the main vibration includes the thickness shear vibration mode, it may be a crystal blank of a different cut (for example, BT cut) other than the AT cut. In addition, the material of the piezoelectric substrate is not limited to quartz, but other piezoelectric materials such as piezoelectric ceramic (for example, PZT) or zinc oxide may be used. The piezoelectric resonator may be MEMS (Micro Electro Mechanical Systems), for example, or a piezoelectric MEMS using a predetermined piezoelectric material such as Si-MEMS, AlN, LT, and PZT.

The first excitation electrode 120 is formed on the first main surface 112 of the piezoelectric substrate 110 and the second excitation electrode 130 is formed on the second main surface 114 of the piezoelectric substrate 110. The first and second excitation electrodes 120 and 130 are a pair of electrodes, and are disposed so that substantially the entire surface overlaps with each other when the XZ' planes are viewed in a plan view.

In the piezoelectric substrate 110, a connection electrode 124 electrically connected to the first excitation electrode 120 with an extended electrode 122 interposed therebetween, and the connection electrode 134 electrically connected to the second excitation electrode 130 with the extended electrode 132 interposed therebetween are formed. More specifically, the extended electrode 122 is drawn from the first excitation electrode 120 toward the Z'-axis negative direction side short side on the first main surface 112, further, it passes through the side surface of the piezoelectric substrate 110 on the X axis negative direction side and is connected to the connection electrode 124 formed on the second main surface 114. On the other hand, the extended electrode 132 drawn from the second excitation electrode 130 toward the Z'-axis negative direction side short side on the second main surface 114, and is connected to the connection electrode 134 formed on the second main surface 114. The connection electrodes 124 and 134 are arranged along the Z'-axis negative direction side short side, and are electrically connected to the substrate 300 with the conductive holding members 340 and 342 interposed therebetween and are mechanically held. The arrangement and pattern shape of the connection electrodes 124, 134 and the extended electrodes 122, 132 are not limited, and can be appropriately changed in consideration of electrical connection with other members.

Each of the above-mentioned electrodes including the first and second excitation electrodes 120 and 130 is formed by, for example, a chromium (Cr) layer formed on the surface of the piezoelectric substrate 110 to increase the bonding force, and a gold (Au) layer is formed. Note that the material is not limited.

The lid member 200 has an opening that opens opposite the first main surface 302 of the substrate 300. As shown in FIG. 2, the lid member 200 is provided with a side wall portion 202 formed so as to rise from the bottom surface of the opening over the entire circumference of the opening, and the side wall portion 202 has an end surface 204 opposite to the first main face 302 of the substrate 300. The end surface 204 is bonded to a sealing frame 350 (described later) formed on the first main surface 302 of the substrate 300 with the bonding material 250 interposed therebetween. The lid member 200 may have a shape capable of accommodating the piezoelectric resonator 100 in the inner space when bonded to the substrate 300, and its shape is not particularly limited. The material of the lid member 200 is not particularly limited, but it may be made of a conductive material such as a metal, for example. According to this, the shield function can be added by electrically connecting the lid member 200 to the ground potential. When the lid member 200 is formed of metal, it may be formed of, for example, an alloy (for example, 42 alloy) containing iron (Fe) and nickel (Ni). Alternatively, a surface layer such as a gold (Au) layer may be further formed on the surface of the lid member 200. By forming a gold layer on the surface, it is possible to prevent oxidation of the lid member 200. Alternatively, the lid member 200 may be a composite structure of an insulating material or a conductive material and an insulating material.

The substrate 300 supports the piezoelectric resonator 100 excitably. In the example shown in FIG. 1, the piezoelectric resonator 100 is excitably supported on the first main surface 302 of the substrate 300 with the conductive holding members 340, 342 interposed therebetween.

In the example shown in FIG. 1, the substrate 300 has a longitudinal direction parallel to the Z' axis direction, a short side direction parallel to the X axis direction, and a thickness direction parallel to the Y' axis direction, it has a substantially rectangular shape in the XZ' plane. The substrate 300 is formed of, for example, a single layer insulating ceramic. In another embodiment, the substrate 300 may be a multilayer in which a plurality of insulating ceramic sheets is stacked. The insulating ceramic sheet is formed by firing. It is preferable that the substrate 300 be made of a heat-resistant material.

A conductor pattern composed of a plurality of conductors is formed on the substrate 300. The conductor pattern includes connection electrodes 320, 322, via conductors 330, 332, a sealing frame 350, and outer electrodes 360, 362, 364, 366.

On the first main surface 302 of the substrate 300, the connection electrodes 320, 322 and the sealing frame 350 are formed. The connection electrode 320 (first connection electrode) and 322 (second connection electrode) have a substantially circular shape, and are arranged such that the piezoelectric resonator 100 is disposed substantially at the center of the first main surface 302 of the substrate 300 and is disposed on the inner side of the outer edge of the substrate 300. Specifically, the connection electrodes 320, 322 are formed near both corners on the Z'-axis negative direction side on the first main surface 302 of the substrate 300. The connection electrode 320 is connected to the connection electrode 124 of the piezoelectric resonator 100 with the conductive holding member 340 interposed therebetween, and the connection electrode 322 is connected to the connection electrode 134 of the piezoelectric resonator 100 with the conductive holding member 342 interposed therebetween. The conductive holding members 340, 342 are formed, for example, by thermal curing of a conductive adhesive.

Hereinafter, the configuration of the connection electrode will be described in detail using the connection electrode 322 as an example. Since the connection electrode 320 is similar to the connection electrode 322, a detailed description thereof will be omitted. In the connection electrode 322 having a multilayer structure, the lowermost layer 322a, the intermediate layer 322b, and the uppermost layer 322c are laminated in this order (see FIG. 2). The lowermost layer 322a is provided by applying a conductive paste by screen-printing. In addition, the intermediate layer 322b and the uppermost layer 322c are provided by plating treatment with the lowermost layer 322a as the base. For example, in each layer of the present embodiment, the lowermost layer 322a is made of molybdenum (Mo) (film thickness is about 8 μm), the intermediate layer 322b is nickel (Ni) (film thickness is about 5 μm), the uppermost layer 322c is gold (Au) (film thickness is about 0.4 μm), but the material of each layer is not limited thereto. In the present embodiment, the connection electrode 322 has a protrusion 323a formed by protrusion of the top surface of the lowermost layer 322a of the connection electrode 322. For example, the protrusion 323a is formed in the vicinity of the center portion of the lowermost layer 322a of the connection electrode 322, and the top surface of the protrusion 323a has a substantially circular shape. In the present embodiment, the maximum value of a height from the first main surface 302 of the substrate 300 to the upper surface of the lowermost layer 322a of the connection electrode 322 (the height of the region where the protrusion 323a is formed of the lowermost layer 322a) and the minimum value (the height of the region of the lowermost layer 322a where the protrusion 323a is not formed) is less than about 1 μm. That is, the difference between the maximum value and the minimum value is less than about 15% of the maximum value of the thickness of the lowermost layer 322a of the connection electrode 322 or less than about 8% of the maximum value of the entire thickness of the connection electrode 32. In addition, protrusions may also be formed in the uppermost layer 322c along the protrusion of the lowermost layer 322a of the connection electrode 322. The uppermost layer 322c of the connection electrode 322 is flattened so that the flatness (JIS B 0621) is not more than a predetermined level (for example, about 5 μm) even when the protrusion is formed. Details of the flattening will be described later.

A through hole penetrating the first main surface 302 and the second main surface 304 of the substrate 300 is provided right under the connection electrodes 320 and 322, and substantially columnar via conductors 330 and 332 are formed in the through hole. The through hole is disposed at the center of the connection electrodes 320, 322 which are substantially circular in plan view. The via conductors 330, 332 are provided, for example, by filling the through holes with a conductive paste by screen-printing. The material of the conductive paste contains, for example, Mo as a main component. In the example shown in FIG. 1, the connection electrode 320 is connected to the via conductor 330 formed in the vicinity of the corner on the X axis negative direction side and the Z' axis negative direction side, and the connection electrode 322 is connected to the via conductor 332 formed in the vicinity of the corner on the X axis positive direction side and the Z' axis negative direction side. The upper surfaces of the via conductors 330, 332 have a substantially circular shape. The diameter of the upper surface of the projecting portion of the connecting electrodes 320, 322 is larger than the diameter of the upper surface of the via conductors 330, 332.

The sealing frame 350 is formed in a substantially frame shape (for example, a substantially rectangular frame shape) over the entire circumference at the peripheral portion of the first main surface 302 of the substrate 300. That is, the sealing frame 350 is formed in a region where the end surface 204 of the side wall portion 202 of the lid member 200 is bonded. The sealing frame 350 is for sealing between the lid member 200 and the substrate 300. Further, when the lid member 200 is a conductive material, the lid member 200 can be grounded with the sealing frame 350 interposed therebetween which is a conductor. The sealing frame 350 includes a lowermost layer 350a, an intermediate layer 350b, and an uppermost layer 350c. The details of each layer are the same as those of the lowermost layer 322a, the intermediate layer 322b, and the uppermost layer 322c in the above-described connection electrode 322, and therefore detailed description thereof is omitted. Like the uppermost layer 322c of the connection electrode, the uppermost layer 350c of the sealing frame 350 is flattened so that the flatness is not more than a predetermined level (for example, about 5 m). Details of the flattening will be described later. The difference of the maximum value of the height from the first main surface 302 of the substrate 300 to the upper surface of the lowermost layer 322a of the connection electrode 322 and the maximum value of the height from the first main surface 302 of the substrate 300 to the upper surface of the lowermost layer 350a of the sealing frame 350 is less than about 1 μm. Thus, the difference between the maximum value of the height from the first main surface 302 of the substrate 300 to the upper surface of the lowermost layer 322a of the connection electrode 322 and the maximum value of the height from the first main surface 302 of the substrate 300 to the upper surface of the lowermost layer 350a of the sealing frame 350 is less than about 15% of the maximum value of the thickness of the lowermost layer 322a of the connection electrode 322 or less than about 8% of the maximum value of the entire thickness of the connection electrode 322.

On the second main surface 304 of the substrate 300, outer electrodes 360, 362, 364, 366 are formed. The outer electrodes 360, 362, 364, 366 have a substantially rectangular shape, and are formed near each corner on the second main surface 304 of the substrate 300. Specifically, the outer electrode 360 is disposed at a corner on the X axis negative direction side and the Z' axis negative direction side, and the outer electrode 366 is disposed at a corner on the X axis positive direction side and on the Z' axis negative direction side, and are electrically connected to the via conductors 330 and 332 formed right above. As a result, the outer electrodes 360, 366 are electrically connected to the first and second excitation electrodes 120, 130 with the via conductors 330, 332, the connection electrodes 320, 322, and the conductive holding members 340, 342 interposed therebetween. Further, in the present embodiment, the outer electrodes 362 and 364 are formed at the remaining corners. Specifically, the outer electrode 362 is disposed at a corner on the X axis positive direction and the Z' axis positive direction side, and the outer electrode 364 is disposed at a corner on the X axis negative direction side and the Z' axis positive direction side. The outer electrodes 362 and 364 are electrodes which are not electrically connected to the first and second excitation electrodes 120 and 130 of the piezoelectric resonator 100 and are formed of the same conductive material as other electrodes. By forming the outer electrodes 362 and 364, it is possible to form the outer electrodes at all the corners, so that the process step of electrically connecting the piezoelectric resonator unit 1 to other members becomes easy. In addition, the outer electrodes 362 and 364 function as grounding electrodes (also referred to as dummy electrodes or floating electrodes) to which the ground potential is supplied. For example, in the case where the lid member 200 is made of a conductive material, the lid member 200 can be electrically connected to the outer electrodes 362 and 364 which are ground electrodes, so that a shielding function can be imparted to the lid member 200. The outer electrodes 362 and 364 may be connected to terminals (terminals not connected to any other electronic elements) provided on a mounting substrate (not shown) on which the piezoelectric resonator unit 1 is mounted. Note that the outer electrodes 360, 362, 364, 366 are also composed of three layers of conductive material like the connection electrodes 320, 322 and the sealing frame 350.

Note that each of the configurations of the connection electrode, the via conductor, the sealing frame, and the outer electrode formed on the substrate 300 is not limited to the above-described example, and various modifications can be applied. For example, in the example shown in FIG. 1, one end (the end portion on the side where the conductive holding members 340 and 342 are disposed) of the piezoelectric resonator 100 is a fixed end and the other end is a free end, however, the piezoelectric resonator 100 may be fixed to the substrate 300 at both ends in the longitudinal direction. That is, a configuration in which one of the connection electrodes 320, 322 is formed on the Z'-axis positive direction side and the other is formed on the Z'-axis negative direction side, such as being disposed on different sides on the first main surface 302 of the substrate 300 may be used. In such a configuration, the piezoelectric resonator 100 is supported by the substrate 300 at both one end and the other end in the longitudinal direction. Further, the connection electrode is not limited to a substantially circular shape, and may be another shape such as a substantially rectangle or a polygon.

The bonding material 250 is provided over the entire periphery of the lid member 200 or the substrate 300 and is disposed between the end surface 204 of the side wall portion 202 of the lid member 200 and the sealing frame 350 formed on the first main surface 302 of the substrate 300. The material of the bonding material 250 is not limited, but in this embodiment it is a gold (Au)-tin (Sn) eutectic alloy. By bonding the lid member and the substrate to each other by metal bonding, when the lid member is made of a conductive material, electric conduction between the lid member and the substrate can be achieved. In addition, the sealing property can be improved.

By bonding both the lid member 200 and the substrate 300 with the bonding material 250 interposed therebetween, the piezoelectric resonator 100 is hermetically sealed in an internal space (cavity) surrounded by the recess of the lid member 200 and the substrate 300. In this case, it is preferable that the pressure in the internal space be a vacuum state which is lower than the atmospheric pressure, so that changes over time due to oxidation of the first and second excitation electrodes 120, 130 are reduced.

With the above configuration, in the piezoelectric resonator unit 1, an alternating electric field is applied between the pair of the first and second excitation electrodes 120 and 130 in the piezoelectric resonator 100 with the outer electrodes 360 and 366 of the substrate 300 interposed therebetween. As a result, the piezoelectric substrate 110 vibrates due to the vibration mode including the thickness shear vibration mode, and the resonance characteristic accompanying the vibration is obtained.

In the piezoelectric resonator unit 1, the flatness of the connection electrodes 320 and 322 formed on the substrate 300 is high and the shape is stable. Therefore, it is possible to reduce variations in the bonding area between the piezoelectric resonator 100 and the conductive holding members 340, 342 and between the connection electrodes 320, 322 and the conductive holding members 340, 342. As a result, the fluctuation range of the bonding strength of the piezoelectric resonator 100 is reduced, and the bonding strength is stabilized. In addition, in the present embodiment, as compared with the configuration in which the protrusion on the upper surface of the connection electrode is sharpened, stress concentration on the protrusion due to heat, impact, etc. are avoided, so that damage of the bonding part of the connection electrodes 320, 322 and the piezoelectric resonator 100 is suppressed. Since the sealing frame 350 has a high degree of flatness, a large bonding area between the lid member 200, the bonding material 250, and the sealing frame 350 is ensured, and the airtightness of the sealing is improved. Further, the outer electrodes 360, 362, 364, and 366 have high flatness similarly to the connection electrodes 320 and 322, so that the stability of the mounting of the piezoelectric resonator unit 1 on the mounting substrate is improved.

In the present embodiment, the configuration, of the four outer electrodes of the substrate 300, two external electrodes 360 and 366 on the Z'-axis negative direction side are electrically connected to the first excitation electrode 120 or the second excitation electrode 130 formed on the piezoelectric resonator 100 with the via conductors 330 and 332, respectively interposed therebetween, two external electrodes 362 and 364 on the Z'-axis positive direction side become dummy electrodes is shown (see FIG. 1). According to this configuration, the distances between the electrical path from the outer electrode 360 to the first excitation electrode 120 and the electrical path from the outer electrode 366 to the second excitation electrode 130 are made substantially equal to substantially equalize the capacitance, accordingly, it becomes possible to improve the frequency characteristic in the excitation vibration of the piezoelectric resonator unit.

Further, the configuration of the connection between the connection electrodes 320, 322 and the outer electrodes 360, 362, 364, 366 in the substrate 300 is not limited to this. For example, the outer electrodes 360 and 362 arranged on one diagonal line of the substrate 300 are electrically connected to the first or second excitation electrodes 120, 130, and the outer electrodes 364 and 366 arranged on the other diagonal line are electrically connected to the dummy electrodes. Specifically, for example, the side of the first excitation electrode 120 forms a via conductor 330 penetrating from the connection electrode 320 to the outer electrode 360, and on the first main surface 302 of the substrate 300, the side of the second excitation electrode 130 is drawn from the connection electrode 322 to above the outer electrode 362 on the Z' axis positive direction side to form a via conductor on the outer electrode 362, and therefore, it may be electrically connected to the outer electrode 362. In the case where the substrate 300 is formed by stacking a plurality of ceramic sheets, the via conductor 332 on the side of the second excitation electrode 130 in the intermediate layer of the substrate is drawn out onto the outer electrode 362 on the Z'-axis positive direction side to open on the outer electrode 362. In addition, in this configuration, in order to make the distances of the electrical paths from the outer electrodes 360, 362 to the first or second excitation electrodes 120, 130 substantially equal, the via conductor 330 on the side of the first excitation electrode 120 may also be formed so as to open on the outer electrode 360 by bypassing the through hole in the intermediate layer of the substrate.

Figure 3:
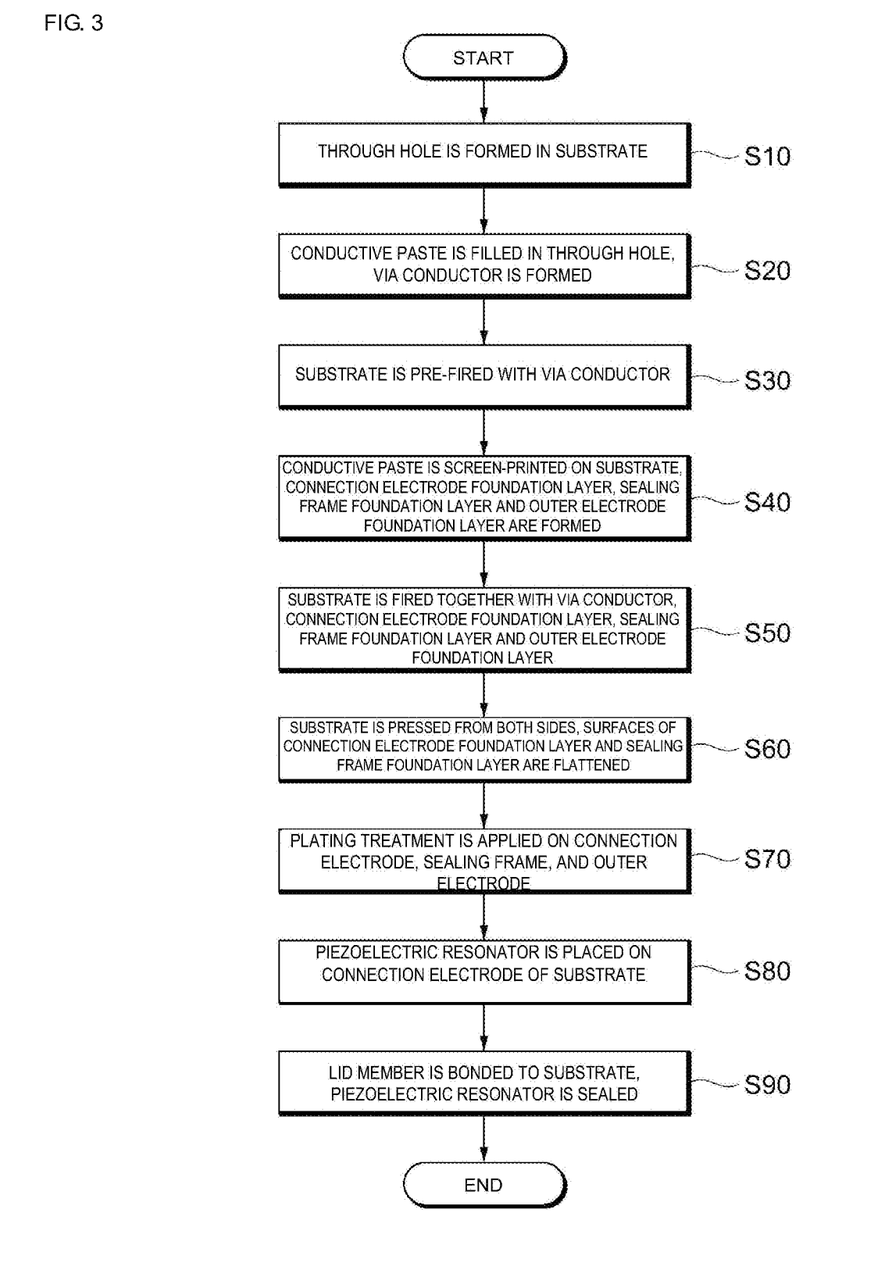
FIG. 3 is a flowchart showing a method for manufacturing a piezoelectric resonator unit according to an embodiment of the present invention.
Figure 5:
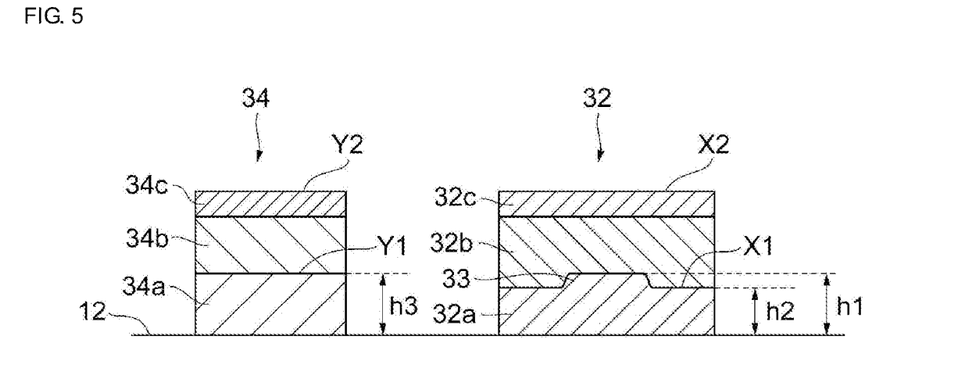
FIG. 5 is a partial cross-sectional view of a substrate of a piezoelectric resonator unit according to an embodiment of the present invention.
Figure 6:
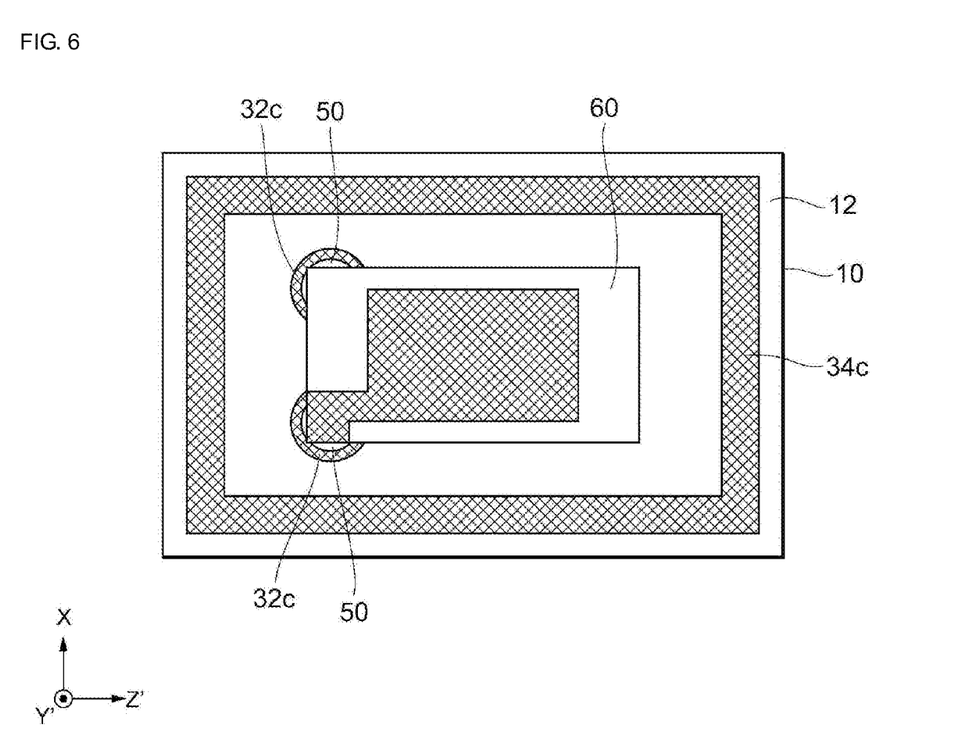
FIG. 6 is a plan view of a piezoelectric resonator unit according to an embodiment of the present invention.

Next, a method for manufacturing a piezoelectric resonator unit according to an embodiment of the present invention will be described with reference to FIGS. 3 to 6. FIG. 3 is a flowchart showing a method of manufacturing a piezoelectric resonator unit according to an embodiment of the present invention, and FIGS. 4A to 4L are drawings showing a procedure of a method of manufacturing a piezoelectric resonator unit according to an embodiment of the present invention, FIG. 5 is a partial cross-sectional view of a substrate of a piezoelectric resonator unit according to one embodiment of the present invention, and FIG. 6 is a plan view of a piezoelectric resonator unit according to one embodiment of the present invention. FIGS. 4A to 4L show sectional views in the same direction as the cross-sectional view in line II-II of FIG. 1 for each process, and FIG. 6 is a view in which the lid member 200 and the bonding material 250 are omitted. Further, a detailed description of the manufacturing methods for the piezoelectric resonator 100 and the lid member 200 will be omitted.

Figure 4A:
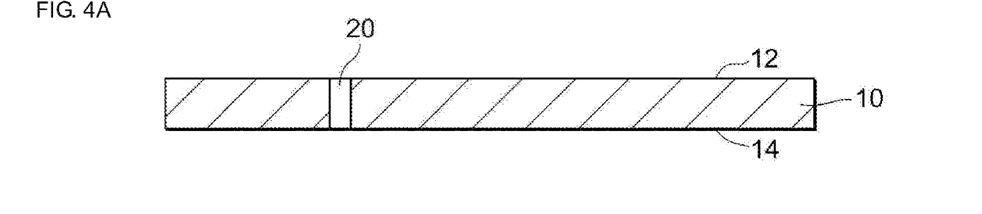
FIG. 4A is a view showing a procedure of a method for manufacturing a piezoelectric resonator unit according to an embodiment of the present invention.

First, as shown in FIG. 4A, a ceramic substrate 10 having a first main surface 12 and a second main surface 14 opposed to the first main surface 12 is prepared, and through holes 20 penetrating the first main surface 12 and the second main surface 14 are formed in the ceramic substrate 10 (S10 in FIG. 3). For example, a green sheet is used as the ceramic substrate 10.

Figure 4B:
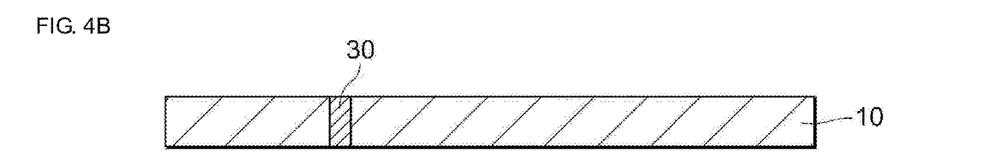
FIG. 4B is a view showing a procedure of a method for manufacturing a piezoelectric resonator unit according to an embodiment of the present invention.
Figure 4C:
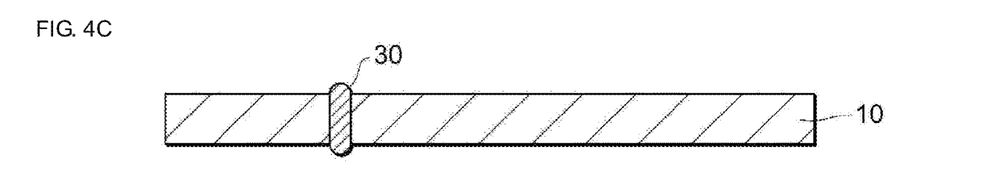
FIG. 4C is a view showing a procedure of a method for manufacturing a piezoelectric resonator unit according to an embodiment of the present invention.

Next, as shown in FIG. 4B, conductive paste is filled in the through hole 20 to form a via conductor 30 (S20 in FIG. 3). The conductive paste can be filled in the through hole 20 by applying a conductive paste by screen-printing from the first main surface 12 of the ceramic substrate 10. For example, the via conductor 30 has a substantially cylindrical shape, and the material of the conductive paste is Mo. After filling the through hole 20 with the conductive paste, the ceramic substrate 10 and the via conductor 30 are pre-fired (S30 in FIG. 3). Here, a difference in shrinkage ratio occurs due to a difference in density, melting point, binder content, etc. between the conductive paste and the ceramic substrate 10. Due to this difference in shrinkage rate, the conductive paste rises from the surfaces of the first main surface 12 and the second main surface 14 of the ceramic substrate 10 (see FIG. 4C).

Figure 4D:
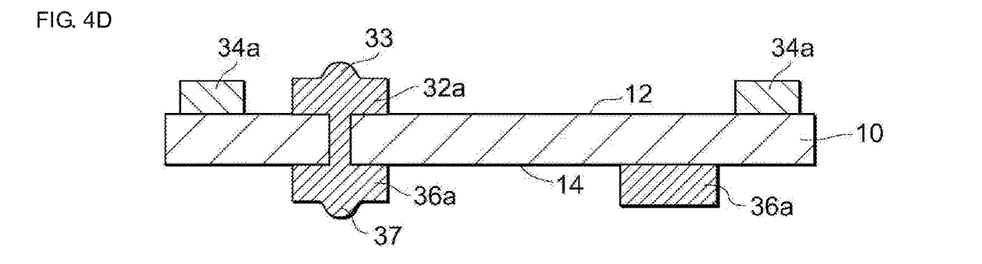
FIG. 4D is a view showing a procedure of a method for manufacturing a piezoelectric resonator unit according to an embodiment of the present invention.

Next, as shown in FIG. 4D, a conductive paste is applied on the ceramic substrate 10 by screen-printing, a substantially circular connecting electrode foundation layer 32a and a substantially square frame shaped sealing frame foundation layer 34a are formed on the first main surface 12 of the ceramic substrate 10, and a substantially rectangular outer electrode foundation layer 36a is formed on the second main surface 14 of the ceramic substrate 10 (S40 in FIG. 3). Here, since the via conductor 30 is raised from the ceramic substrate 10 by pre-firing, the connection electrode foundation layer 32a and the outer electrode foundation layer 36a formed so as to cover the end face of the via conductor 30 (for example, the center portion of the connection electrode foundation layer 32a and the outer electrode ground layer 36a), the region corresponding to just above or directly below the via conductor 30 rises and the protrusions 33, 37 are formed (see FIG. 4D).

Next, the ceramic substrate 10 is fired together with the via conductor 30, the connection electrode foundation layer 32a, the sealing frame foundation layer 34a, and the outer electrode foundation layer 36a (S50 in FIG. 3). Also in the sintering by firing, depending on the difference in sintering shrinkage rate between the ceramic substrate 10 and the via conductor 30, the via conductor 30 rises from the ceramic substrate 10 to be formed.

Figure 4E:
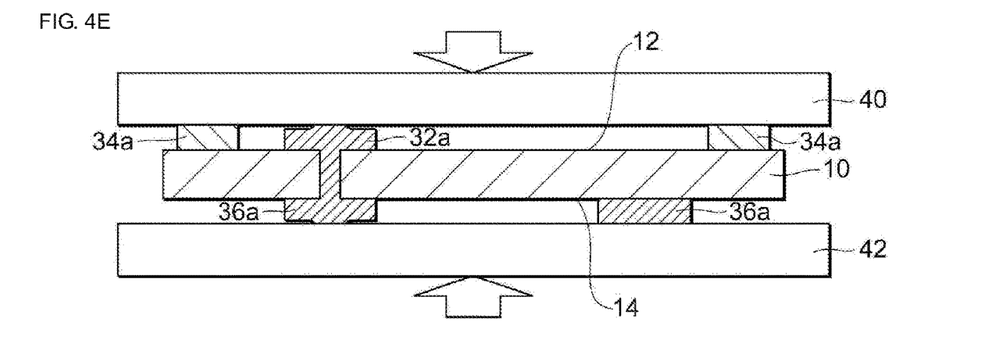
FIG. 4E is a view showing a procedure of a method for manufacturing a piezoelectric resonator unit according to an embodiment of the present invention.
Figure 4F:
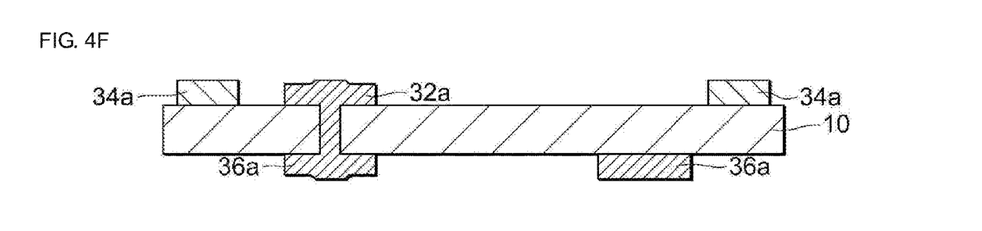
FIG. 4F is a view showing a procedure of a method for manufacturing a piezoelectric resonator unit according to an embodiment of the present invention.

Next, as shown in FIGS. 4E and 4F, using the first flat plate 40 and the second flat plate 42, the ceramic substrate 10 is pinched from the first main surface 12 side and the second main surface 14 side and pressed with a predetermined weight, as a result, the surfaces of the connection electrode foundation layer 32a and the sealing frame foundation layer 34a are planarized (S60 in FIG. 3). Specifically, the protrusion 33 formed on the connection electrode foundation layer 32a is pressed, and the upper surface of the connection electrode foundation layer 32a is planarized. As shown in FIG. 5, the difference between the maximum value h1 and the minimum value h2 of the height from the first main surface 12 of the ceramic substrate 10 to the upper surface X1 of the connection electrode foundation layer 32a can be less than about 1 μm. Also with respect to the sealing frame foundation layer 34a, the upper surface Y1 is flattened by the pressing. Furthermore, since the connection electrode foundation layer 32a and the sealing frame foundation layer 34a are pressed by the same first flat plate 40, the difference between the maximum height h1 from the first main surface 12 of the ceramic substrate 10 to the upper surface of the connection electrode foundation layer 32a and the maximum height h3 from the first main surface 12 of the ceramic substrate 10 to the upper surface Y1 of the sealing frame foundation layer 34a, can be less than about 1 μm. In this embodiment, since the connection electrode foundation layer 32a is substantially circular in a plan view of the XZ' axis plane, the collapsed shape of the protrusion 33 is more stable than in the case where the connection electrode foundation layer is substantially rectangular. Since planarization of the outer electrode foundation layer 36a is similar to that of the connection electrode foundation layer 32a, a detailed description thereof will be omitted.

Figure 4G:
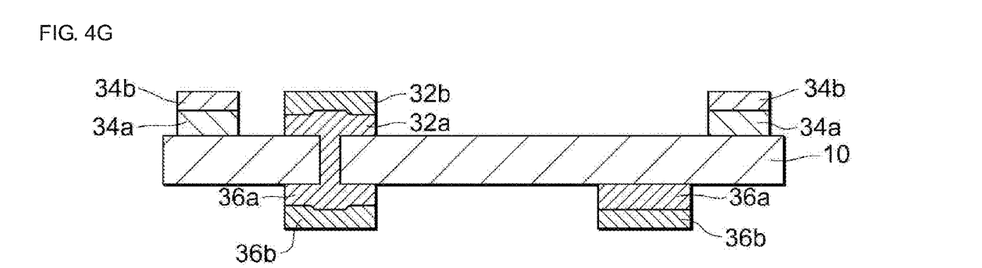
FIG. 4G is a view showing a procedure of a method for manufacturing a piezoelectric resonator unit according to an embodiment of the present invention.
Figure 4H:
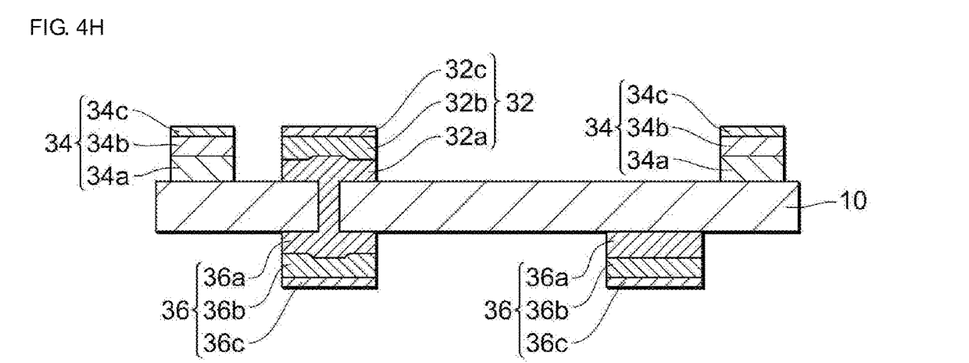
FIG. 4H is a view showing a procedure of a method for manufacturing a piezoelectric resonator unit according to an embodiment of the present invention.

Next, as shown in FIGS. 4G and 4H, plating treatment is applied to the ceramic substrate 10 to form a plating layer on the connection electrode foundation layer 32a, the sealing frame foundation layer 34a, and the outer electrode foundation layer 36a (S70 in FIG. 3). The plating process includes, for example, two plating processes. Explaining the connection electrode 32 as an example, the first plating layer 32b is formed so as to cover the connection electrode foundation layer 32a in the first plating process, the second plating layer 32c is formed so as to cover the first plating layer 32b in the second plating process. The material of the first plating layer 32b is Ni, for example, and the material of the second plating layer 32c is Au, for example, the material of the plating layer is not limited thereto. The melting point (about 2622 degrees Celsius in the case of Mo) of the connecting electrode foundation layer 32a is higher than the sintering temperature (about 1600 degrees Celsius) of the ceramic substrate 10 and the melting point of the first plating layer 32b of the connection electrode 32 (about 1455 degrees Celsius in the case of Ni), and the melting point of the second plating layer 32c of the connection electrode 32 (about 1063 degrees Celsius in the case of Au) is lower than the sintering temperature of the ceramic substrate 10. In the plating process, since the upper surface X1 of the connection electrode foundation layer 32a is flattened in the preceding step (S60 in FIG. 3), the surfaces of the first and second plating layers formed on the upper surface X1 are also planarized. Specifically, for example, the flatness of the upper surface X2 of the second plating layer 32c of the connection electrode 32 and the flatness of the upper surface Y2 of the second plating layer 34c of the sealing frame 34 should be maintained at a predetermined level (e.g. about 5 μm) or less. It is to be noted that either the electrolytic plating treatment or the electroless plating treatment may be used for the plating treatment. In the following description, the connection electrode foundation layer 32a, the first plating layer 32b, and the second plating layer 32c may be collectively referred to as a "connection electrode 32". The same applies to the sealing frame 34 and the outer electrode 36.

Figure 4I:
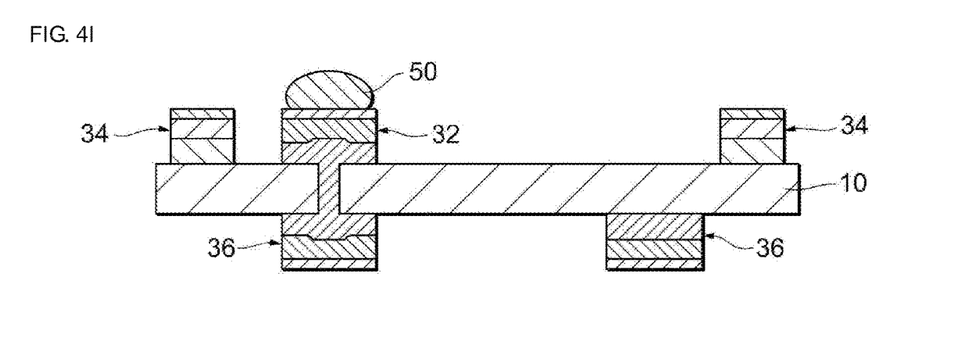
FIG. 4I is a view showing a procedure of a method for manufacturing a piezoelectric resonator unit according to an embodiment of the present invention.
Figure 4J:
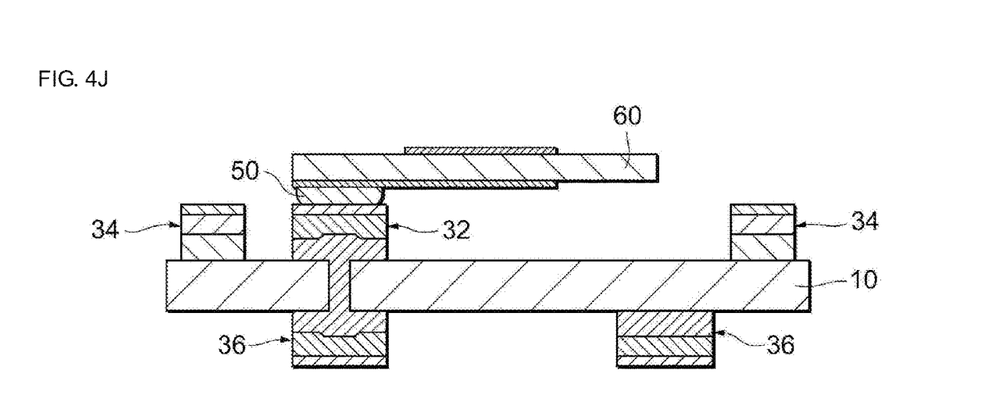
FIG. 4J is a view showing a procedure of a method for manufacturing a piezoelectric resonator unit according to an embodiment of the present invention.

Next, as shown in FIGS. 4I, 4J and 6, the conductive adhesive 50 is placed on the connection electrode 32 formed on the first main surface 12 of the ceramic substrate 10, the piezoelectric resonator 60 is placed thereon (S80 in FIG. 3). By placing the piezoelectric resonator 60 in the vicinity of the center portion on the first main surface 12 of the ceramic substrate 10, the connection electrodes (corresponding to the connection electrodes 124, 134 shown in FIG. 1) included in the piezoelectric resonator 60 are electrically connected to the second plating layer 32c of the connection electrode 32 formed on the first main surface 12 of the ceramic substrate 10 with the conductive adhesive 50 interposed therebetween (see FIG. 6). In the present embodiment, the flatness of the upper surface X2 of the connection electrode 32 is improved by the pressing force (S60 in FIG. 3) described above. Therefore, as compared with the configuration in which the protrusion on the upper surface of the connection electrode 32 is high and the shape of the conductive adhesive 50 is not stabilized without performing the above-described pressing force, it is possible to reduce the fluctuation range of the bonding area between the piezoelectric resonator 60 and the conductive adhesive 50 and between the upper surface X2 of the connection electrode 32 and the conductive adhesive 50. As a result, the fluctuation range of the bonding strength of the piezoelectric resonator 60 is reduced, and the bonding strength is stabilized. In particular, due to the influence of capillary phenomenon of the conductive adhesive, wetting-up property becomes higher toward narrower gap region, the upper surface X2 of the connection electrode 32 is flattened so that the variation in the gap between the piezoelectric resonator 60 and the conductive adhesive 50 is reduced, as a result, wettablility of the conductive adhesive 50 becomes easy to stabilize. Therefore, the effect of improving the bonding strength of the piezoelectric resonator can be obtained. Furthermore, as long as the connection electrode 32 has a substantially circular shape, the wettablility of the conductive adhesive 50 arranged near the center of the circle is further stabilized due to the symmetry of the circle. Note that the conductive adhesive 50 becomes a conductive holding member after curing.

Figure 4K:
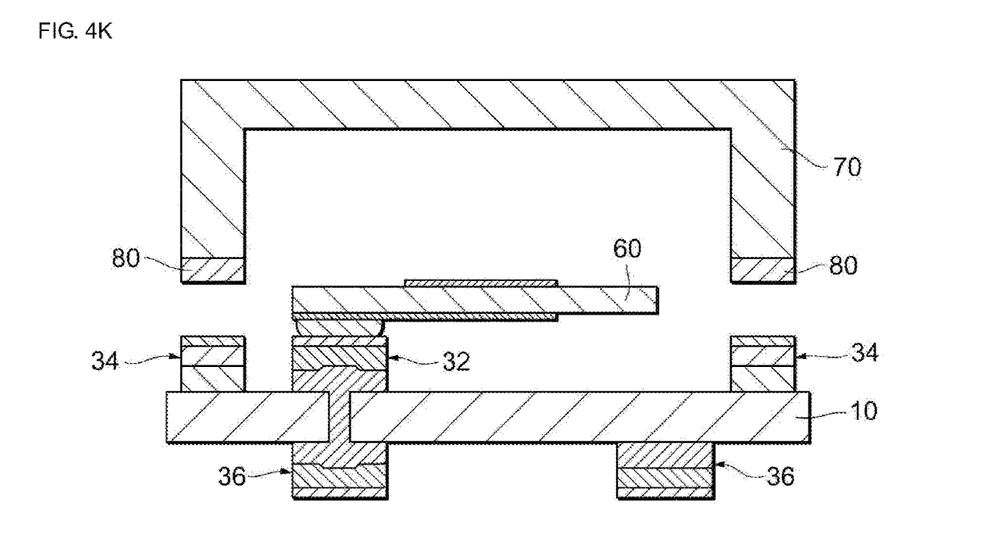
FIG. 4K is a view showing a procedure of a method for manufacturing a piezoelectric resonator unit according to an embodiment of the present invention.
Figure 4L:
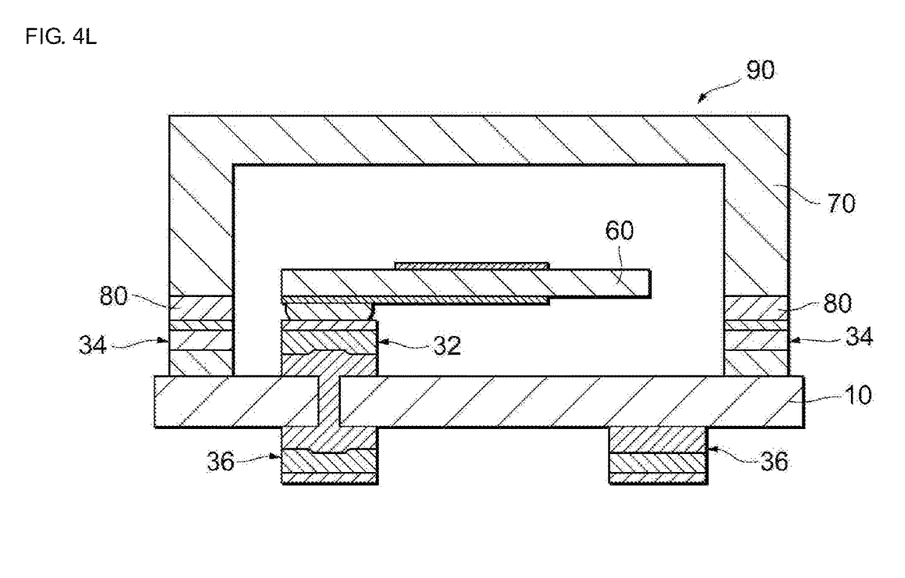
FIG. 4L is a view showing a procedure of a method for manufacturing a piezoelectric resonator unit according to an embodiment of the present invention.

Finally, as shown in FIGS. 4K and 4L, the lid member 70 is bonded to the first main surface 12 of the ceramic substrate 10 with the bonding material 80 interposed therebetween, and the piezoelectric resonator 60 is sealed (S90 in FIG. 3). The bonding material 80 is attached to the end face of the side wall portion of the lid member 70, for example, and then bonded to the sealing frame 34 formed on the first main surface 12 of the ceramic substrate 10. In the present embodiment, since the flatness of the upper surface Y2 of the sealing frame 34 is improved by the above-described pressing (S60 in FIG. 3), compared with a configuration in which the lid member is bonded to the sealing frame without the above-described pressing, the bonding area is increased, and the airtightness of the sealing by the lid member is improved.

According to the manufacturing method described above, the piezoelectric resonator unit 90 corresponding to the piezoelectric resonator unit 1 shown in FIGS. 1 and 2 is manufactured. In the piezoelectric resonator unit 90, even if the flatness of the fired ceramic substrate 10 is low, since the flatness of the connection electrode 32 formed on the ceramic substrate 10 is high, variations in bonding areas between the piezoelectric resonator 60 and the conductive adhesive 50 and between the connection electrode 32 and the conductive adhesive 50 are reduced. As a result, the fluctuation range of the bonding strength of the piezoelectric resonator 60 is reduced, and the bonding strength is stabilized. In addition, stress concentration on the protrusion 33 on the upper surface of the connection electrode 32 is avoided, damage of the bonding part between the piezoelectric resonator 60 and the connection electrode 32 is suppressed. Since the sealing frame 34 also has high flatness, a large bonding area between the bonding material 80 and the sealing frame 34 is secured, and the airtightness of the sealing is improved. Furthermore, similarly to the connection electrode 32, the protrusion 37 is suppressed for the outer electrode 36 to improve the flatness, so that the stability of the mounting of the piezoelectric resonator unit 90 on the mounting substrate is improved.

In addition, in the present embodiment, a method of forming the connection electrode foundation layer 32a and the sealing frame foundation layer 34a by screen-printing after forming the via conductor 30 is shown, but instead of this method, screen-printing may be performed on the ceramic substrate 10 having the through hole 20 formed therein, the via conductor, the connection electrode foundation layer, and the sealing frame foundation layer may be formed in one step and then fired.

An exemplary embodiment of the present invention has been described above. In the manufacturing method of the piezoelectric resonator unit, the via conductor 30 filling the through hole 20, the connection electrode foundation layer 32a, and the sealing frame foundation layer 34a provided in a substantially frame shape are formed on the ceramic substrate 10, after firing, the ceramic substrate 10 is pressed from the first main surface 12 side and the second main surface 14 side. This flattens the surface of the connection electrode foundation layer 32a and the surface of the sealing frame foundation layer 34a and improves the flatness of the second plating layer 32c of the connection electrode 32 and the second plating layer 34c of the sealing frame 34. Therefore, the occurrence of protrusions on the connection electrode 32 is suppressed, the variation in the bonding area between the connection electrode 32 and the conductive holding member and between the conductive holding member and the piezoelectric resonator 60 is reduced, and the bonding strength can be stabilized. Further, by improving the flatness of the sealing frame 34, it is possible to secure a large bonding area between the sealing frame 34 and the lid member 70, and to improve the airtightness of the sealing of the lid member 70.

Further, the via conductor 30, the connection electrode foundation layer 32a, and the sealing frame foundation layer 34a may be formed by screen-printing. The method of forming the via conductor 30, the connection electrode foundation layer 32a, and the sealing frame foundation layer 34a are not limited to this.

In addition, the via conductor 30, the connection electrode foundation layer 32a, and the sealing frame foundation layer 34a may contain Mo as a main component. The material of the via conductor 30, the connection electrode foundation layer 32a, and the sealing frame foundation layer 34a are not limited to this.

In addition, pressing of the ceramic substrate 10 may be performed by pinching the ceramic substrate 10 from the first main surface 12 side and the second main surface 14 side using the first and second flat plates 40, 42. The pressing method is not limited to this.

A difference in height from the first main surface 12 of the ceramic substrate 10 to the upper surface of the connection electrode foundation layer 32a may be less than about 1 μm. As a result, the occurrence of protrusions on the connection electrode 32 is suppressed, and the bonding strength of the piezoelectric resonator 60 can be improved. The maximum value of the height from the first main surface 12 of the ceramic substrate 10 to the upper surface of the connection electrode foundation layer 32a and the height from the first main surface 12 of the ceramic substrate 10 to the upper surface of the sealing frame foundation layer 34a may be less than about 1 μm.

Further, the flatness of the connection electrode 32 and the sealing frame 34 may be about 5 μm or less. Whereby, in addition to the piezoelectric resonator 60 placed on the connection electrode 32, the bonding strength of the lid member 70 placed on the sealing frame 34 can also be improved.

In addition, the piezoelectric resonator 60 includes a piezoelectric substrate having first and second main surfaces, a first excitation electrode provided on the first main surface of the piezoelectric substrate, and a second excitation electrode provided on the second main surface of the piezoelectric substrate, the first and second excitation electrodes may be each electrically connected to the first or second connection electrode with the conductive holding member interposed therebetween. The configuration of the connection between the first and second excitation electrodes and the connection electrode is not limited to this.

Further, after the outer electrode foundation layer 36a is formed on the second main surface 14 of the ceramic substrate 10 and fired, the surface of the outer electrode foundation layer 36a may be flattened by pressing the ceramic substrate 10. Whereby, the flatness of the outer electrode 36 is improved, and the stability of the mounting of the piezoelectric resonator unit 90 on the mounting substrate is improved.

In addition, the piezoelectric resonator unit 1 includes the via conductors 330 and 332 filled in the through holes in the substrate 300, connection electrodes 320 and 322 provided on the first main surface 302, and a sealing frame 350 provided in a substantially frame shape on the first main surface 302, the height difference from the first main surface 302 of the substrate 300 to the upper surface of the lowermost layer of the connection electrodes 320, 322 is less than about 1 μm, the maximum value of the height from the first main surface 302 of the substrate 300 to the top surface of the lowermost layer of the connection electrodes 320 and 322 and the maximum value of the height from the first main surface 302 of the substrate 300 to the top surface of the lowermost layer of the sealing frame 350 are less than about 1 μm, and the flatness of the uppermost layer of the connection electrodes 320 and 322 and the uppermost layer of the sealing frame 350 is less than about 5 μm. As a result, generation of protrusions in the connection electrodes 320, 322 is suppressed, so that variation in bonding area between the upper surfaces of the connection electrodes 320, 322 and the conductive holding members 340, 342 and the conductive holding members 340, 342 and the piezoelectric resonator 100 is reduced, the bonding strength of the piezoelectric resonator 100 is stabilized. Further, by improving the flatness of the sealing frame 350, a large bonding area between the sealing frame 350 and the lid member 200 is secured, and the airtightness of the sealing of the lid member 200 is improved.

Further, the connection electrodes 320, 322 have protrusions formed by protrusion of the top surface of the lowermost layer of the connection electrodes, the top surfaces of the protrusions and the top surfaces of the via conductors have a substantially circular shape, the diameter of the upper surface may be larger than the diameter of the upper surface of the via conductor. The shapes and sizes of the protrusion and the via conductors are not limited to this.

The melting points of the lowermost layer of the connection electrodes 320 and 322 and the lowermost layer of the sealing frame 350 are higher than the sintering temperature of the substrate 300 and the melting points of the uppermost layer of the connection electrodes 320 and 322 and the uppermost layer of the sealing frame 350 may be lower than the sintering temperature of the substrate 300. The melting point of each layer is not limited to this.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A piezoelectric resonator unit, comprising:
   a ceramic substrate having a first main surface and a second main surface opposed to the first main surface;
   a via conductor filling a through hole penetrating the ceramic substrate from the first main surface to the second main surface;
   a connection electrode connected to the via conductor on the first main surface;
   a sealing frame having a frame shape on the first main surface;
   a piezoelectric resonator electrically connected to the connection electrode; and
   a lid member bonded to the first main surface of the ceramic substrate so that the piezoelectric resonator is sealed in a space between the ceramic substrate and the lid member,
   wherein the connection electrode and the sealing frame each have a multilayer structure including a lowermost layer and an uppermost layer,
   a first difference between a maximum value and a minimum value of a height from the first main surface of the ceramic substrate to an upper surface of the lowermost layer of the connection electrode is less than 1 μm,
   a second difference between the maximum value of the height from the first main surface of the ceramic substrate to the upper surface of the lowermost layer of the connection electrode and a maximum value of a height from the first main surface of the ceramic substrate to an upper surface of the lowermost layer of the sealing frame is less than 1 μm, and
   a flatness of the uppermost layer of the connection electrode and the uppermost layer of the sealing frame is 5 μm or less.

2. The piezoelectric resonator unit according to claim 1, wherein the connection electrode includes a protrusion on the upper surface of the lowermost layer of the connection electrode.

3. The piezoelectric resonator unit according to claim 2, wherein an upper surface of the protrusion and an upper surface of the via conductor have a circular shape, and
   a diameter of the upper surface of the protrusion is larger than a diameter of the upper surface of the via conductor.

4. The piezoelectric resonator unit according to claim 1, wherein a melting point of each of the lowermost layer of the connection electrode and the lowermost layer of the sealing frame is higher than a sintering temperature of the ceramic substrate, and
   a melting point of each of the uppermost layer of the connection electrode and the uppermost layer of the sealing frame is lower than the sintering temperature of the ceramic substrate.

5. The piezoelectric resonator unit according to claim 1, wherein the via conductor, the connection electrode, and the sealing frame contain Mo.

6. The piezoelectric resonator unit according to claim 1, wherein the piezoelectric resonator includes a piezoelectric substrate having a first main surface and a second main surface opposed to the first main surface, a first excitation electrode on the first main surface of the piezoelectric substrate, and a second excitation electrode on the second main surface of the piezoelectric substrate,
   the connection electrode comprises first and second connection electrodes, and
   the first and second excitation electrodes are electrically connected to the first and second connection electrodes, respectively.

7. The piezoelectric resonator unit according to claim 1, further comprising:
   an outer electrode on the second main surface of the ceramic substrate and connected to the via conductor.

* * * * *